(12) United States Patent
Liu

(10) Patent No.: US 7,064,037 B2
(45) Date of Patent: Jun. 20, 2006

(54) SILICON-GERMANIUM VIRTUAL SUBSTRATE AND METHOD OF FABRICATING THE SAME

(75) Inventor: Jin Ping Liu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 72 days.

(21) Appl. No.: 10/755,501

(22) Filed: Jan. 12, 2004

(65) Prior Publication Data

US 2005/0153495 A1 Jul. 14, 2005

(51) Int. Cl.
- *H01L 21/336* (2006.01)
- *H01L 21/20* (2006.01)
- *H01L 21/36* (2006.01)

(52) U.S. Cl. ............. 438/285; 438/483; 438/509

(58) Field of Classification Search ........... 438/285, 438/197, 509, 286, 46, 22, 39, 47, 483
See application file for complete search history.

(56) References Cited

U.S. PATENT DOCUMENTS

| | | | | |
|---|---|---|---|---|
| 6,251,751 B1 | | 6/2001 | Chu et al. ............ | 438/439 |
| 6,281,518 B1 | * | 8/2001 | Sato ................... | 257/13 |
| 6,350,993 B1 | | 2/2002 | Chu et al. ............ | 257/19 |
| 6,403,975 B1 | * | 6/2002 | Brunner et al. ....... | 257/15 |
| 6,492,216 B1 | * | 12/2002 | Yeo et al. ............ | 438/197 |
| 6,524,935 B1 | | 2/2003 | Canaperi et al. ...... | 438/478 |
| 6,645,784 B1 | * | 11/2003 | Tayebati et al. ...... | 438/46 |
| 6,645,836 B1 | * | 11/2003 | Kanzawa et al. ...... | 438/509 |
| 6,657,233 B1 | * | 12/2003 | Sato et al. ........... | 257/79 |
| 6,667,489 B1 | * | 12/2003 | Suzumura et al. ..... | 257/12 |

* cited by examiner

*Primary Examiner*—Walter L Lindsay, Jr.
(74) *Attorney, Agent, or Firm*—George D. Saile; Stephen B. Ackerman

(57) ABSTRACT

A method of forming a relaxed silicon-germanium layer for accommodation of an overlying silicon layer formed with tensile strain, has been developed. The method features growth of multiple composite layers on a semiconductor substrate, with each composite layer comprised of an underlying silicon-germanium-carbon layer and of an overlying silicon-germanium layer, followed by the growth of an overlying thicker silicon-germanium layer. A hydrogen anneal procedure performed after growth of the multiple composite layers and of the thicker silicon-germanium layer, results in a top composite layer now comprised with an overlying relaxed silicon-germanium layer, exhibiting a low dislocation density. The presence of silicon-carbon micro crystals in each silicon-germanium-carbon layer reduces the formation of, and the propagation of threading dislocations in overlying silicon-germanium layers, therefore also reducing extension of these defects into an overlying silicon layer, wherein the tensile strained silicon layer will be used to accommodate a subsequent device structure.

27 Claims, 2 Drawing Sheets

SILICON-GERMANIUM VIRTUAL SUBSTRATE AND METHOD OF FABRICATING THE SAME

BACKGROUND OF THE INVENTION (1) Field of the Invention

The present invention relates to methods used to fabricate semiconductor devices and more specifically to a method of forming a relaxed underlying layer used to accommodate an overlying stained silicon layer.

(2) Description of Prior Art

The ability to form devices such as a metal oxide semiconductor field effect transistor (MOSFET) in a silicon layer under tensile strain, has allowed the performance of the MOSFET to be increased via enhanced mobility of carriers in the strained silicon channel region. Methods of forming tensile strained silicon layers include forming this layer on an underlying relaxed layer such as a silicon-germanium layer. Relaxed silicon-germanium on an underlying silicon substrate has been called a silicon-germanium virtual substrate. The growth of a relaxed semiconductor layer such as silicon-germanium can be challenging since it encompasses controlled nucleation, propagation, and interaction of misfit dislocations that terminate with threading arms that extend to the surface and then can be replicated in subsequently grown layers such as the overlying strained silicon layer needed for accommodation of a subsequent device. The defects in the strained silicon layer resulting from the misfit dislocations in the underlying relaxed silicon-germanium layer, can deleterious influence MOSFET leakage and yield.

The crystalline quality of the relaxed silicon-germanium layer can be improved by growing a compositionally graded, thick silicon-germanium layer, at a thickness greater than a micrometer. The compositionally graded relaxed layer features decreasing germanium content from the bottom to the top surface of the layer. This solution however is costly in terms of processing cost and time since between about 1 to 3 micrometers of a relaxed layer is needed. In addition the density of the threading arms is not homogeneous in the relaxed silicon-germanium layer, therefore sometimes resulting in regions of overlying strained silicon layers with a higher than desired propagation of defects.

The present invention will describe a method of forming a buffer layer comprised of silicon-germanium, via use of inserting silicon-germanium-carbon layers into a composite layer that terminates with an overlying relaxed silicon-germanium buffer layer. The silicon-germanium layer, overlying a silicon-germanium-carbon layer now features a lower density of threading arms or dislocations than counterpart silicon-germanium layers formed without being a component in a composite layer comprised with a silicon-germanium-carbon component. The silicon-germanium-carbon components of the composite layer act as a defect filtering layer allowing the top layer of silicon-germanium to be a relaxed, low defect density buffer layer for an overlying strained silicon layer. Prior art such as Kanzawa et al in U.S. Pat. No. 6,645,836, Canaperi et al in U.S. Pat. No. 6,524,935, Brunner et al in U.S. Pat. No. 6,403,975, Chu et al in U.S. Pat. No. 6,350,993, and Chu et al in U.S. Pat. No. 6,251,751, describe methods of growing silicon-germanium-carbon, silicon-germanium and silicon-carbon; growing strained silicon on relaxed silicon-germanium; growing epitaxial germanium on strained silicon-germanium; and growing constant or graded silicon-germanium. However none of the above prior art describe the procedure described in the present invention in which all components of the composite layer are grown at the same temperature in situ the same growth system, thus allowing multiple composite layers comprised of silicon-germanium and silicon-germanium-carbon, to easily be obtained. These advantages are expected to improve the degree of strain relaxation as a result of the presence of multiple silicon-germanium-carbon filtering components, as well reducing cost and throughput as a result of using a single growth system and a similar growth temperature for each component of the composite layer.

SUMMARY OF THE INVENTION

It is an object of this invention to form a strained silicon layer on an underlying relaxed silicon-germanium buffer layer.

It is another object of this invention to obtain a virtual substrate, relaxed silicon-germanium buffer layer featuring reduced threading arms or defects.

It is still another object of this invention to obtain a low defect density, relaxed layer such as a silicon-germanium, featured as an overlying component of multiple composite layers, each composite comprised of silicon-germanium and silicon-germanium-carbon, and wherein the silicon-germanium-carbon layer component acts as a filtering layer enabling lower defect density of an overlying silicon-germanium component to be realized.

It is still yet another object of this invention to grow all component layers of the composite layer in situ, using the same growth temperature.

In accordance with the present invention a group of multiple composite layers, each comprised with an overlying silicon-germanium layer and an underlying silicon-germanium-carbon layer, are used to allow a reduced defect density of a silicon-germanium layer to be realized, and wherein the low defect density, relaxed silicon-germanium layer is used to accommodate an overlying strained silicon layer, is described. A semiconductor substrate is used to accommodate a first composite layer comprised of an underlying silicon-germanium-carbon layer, and an overlying silicon-germanium layer, each grown at the same temperature in situ in the same growth or deposition apparatus. Multiple composite layers, each comprised with the same underlying silicon-germanium-carbon component and overlying silicon-germanium component, are formed on the underlying first composite layer, all grown again at the same temperature in situ in the same growth or deposition apparatus. An anneal procedure is performed at a temperature greater than the temperature used for composite layer growth, resulting in a low defect density, top layer comprised of relaxed silicon-germanium. A silicon layer is next grown on the underlying relaxed silicon-germanium layer, with the resulting silicon layer featuring the desired tensile strain condition.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
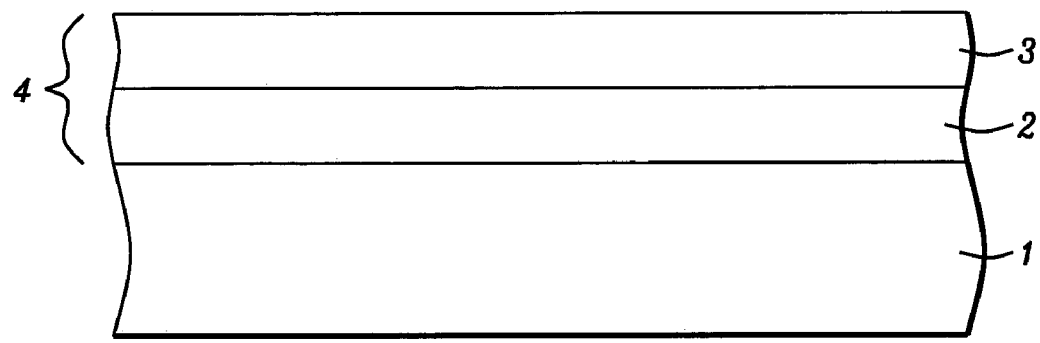
FIGS. 1–3, which schematically in cross-sectional style describe the key stages in forming a silicon layer featuring tensile strain on an underlying stack of composite layers, with each composite layer comprised with an overlying silicon-germanium layer and an underlying silicon-germanium-carbon layer.

The method of forming a silicon layer with tensile strain on a relaxed silicon-germanium layer, wherein the relaxed silicon-germanium layer is an overlying layer of a composite layer comprised with an underlying silicon-germanium-carbon layer, and wherein the composite layer in turn is the top component of a group of composite layers each comprised of a silicon-germanium component on an underlying silicon-germanium-carbon component, will now be described in detail. Semiconductor substrate 1, as described in the present invention and shown schematically in FIG. 1, is comprised of P type, single crystalline silicon featuring a <100> crystallographic orientation. However if desired semiconductor substrate 1, can be comprised of N type material with crystallographic orientations different than <100>. First composite layer 4, comprised of underlying silicon-germanium-carbon layer 2, and overlying silicon-germanium layer 3, is formed on semiconductor substrate 1. The essence of this invention is to form a silicon-germanium layer with a minimum of defects and a minimum of threading dislocations such that the silicon-germanium layer will be in a relaxed situation in turn allowing an overlying silicon layer to be formed wherein the silicon layer will be in a desired tensile strain situation. The decreased level of threading dislocations in the underlying silicon-germanium layer as a result of being formed on a silicon-germanium-carbon layer, will result in a less defective overlying silicon layer. The presence of a silicon-germanium-carbon layer underlying a silicon-germanium layer allows silicon-carbon micro crystals to be dispersed in this layer, with the silicon carbon micro crystals allowing formation of an overlying relaxed silicon-germanium layer to be formed with less threading dislocations than found in counterpart silicon-germanium layers formed on non-silicon-germanium-carbon underlays.

Therefore silicon-germanium-carbon layer 2, is formed to a thickness between about 20 to 500 Angstroms via molecular beam epitaxy (MBE), or via low pressure chemical vapor deposition (LPCVD) procedures, at a temperature between about 400 to 600° C., using silane or disilane as a silicon source, using germane as a germanium source, and using $CH_3SiH_3$ as a carbon source. Silicon-germanium-carbon layer 2, shown schematically in FIG. 1, is comprised with an atomic percent of germanium between about 20 to 35%, and with an atomic percent of carbon between about 0.5 to 3%. After growth of silicon-germanium-carbon layer 2, the carbon source is turned off and growth of overlying silicon-germanium layer 3, is achieved in the same apparatus and at the same temperature used to grow underlying silicon-germanium-carbon layer 2. Silicon-germanium layer 3, is grown to a thickness between about 20 to 500 Angstroms, featuring a germanium atomic percent between about 20 to 35%. The composite layer of silicon-germanium on silicon-germanium-carbon acts as a buffering layer allowing a thicker silicon-germanium layer 11, grown with a constant germanium content to be grown on the underlying composite layer, with the thicker silicon-germanium layer 11, allowing for subsequent overlay of a strained silicon layer which in turn will accommodate a transistor device. Thus silicon-germanium layer 11, is epitaxially grown in situ on the underlying composite layer at a thickness between about 2,000 to 10,000 Angstroms, with a constant germanium atomic content between about 20 to 35%, again using silane and germane as reactants.

Figure 2:
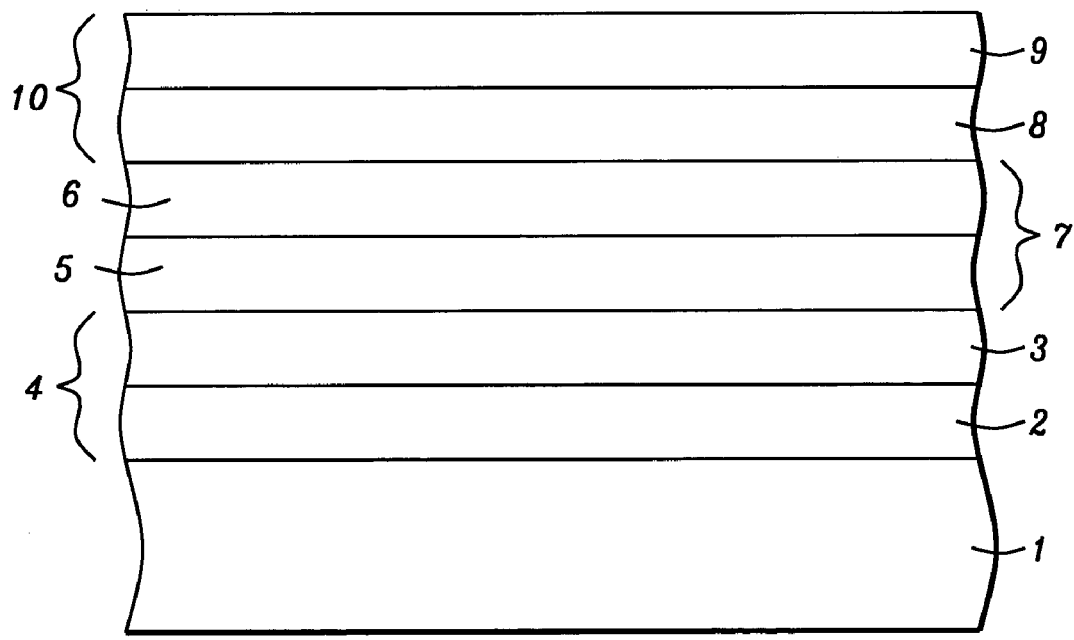

Although the presence of underlying silicon-germanium-carbon layer 2, in composite layer 4, will allow a subsequent overlying silicon-germanium layer, such as silicon-germanium layer 11, schematically shown in FIG. 1, to be grown in a relaxed situation and with less threading dislocations than counterparts formed on non-silicon-germanium-carbon layers, further defect density reductions in silicon-germanium layers can be achieved if the silicon-germanium layer is underlaid by multiple composite layers, each again comprised of an underlying silicon-germanium-carbon layer and an overlying silicon-germanium layer. FIG. 2, schematically shows composite layer 7, in turn overlaid by composite layer 10. Silicon-germanium component 9, of composite layer 10, will feature an even lower defect density than counterpart silicon-germanium component 3, of composite layer 4. The specific components of composite layers 7 and 10, are formed using identical growth conditions previously described for the components of composite layer 4. Therefore MBE or LPCVD procedures are again used to grow silicon-germanium-carbon layers 5 and 8, to a thickness between about 20 500 Angstroms, using a growth temperature and a reactant chemistry used previously for growth of silicon-germanium-carbon layer 2. In turn MBE or LPCVD procedures and growth conditions previously applied to grow silicon-germanium layer 3, are again employed to grow silicon-germanium layers 6 and 9. The result of the growth of multiple composite layers is schematically shown in FIG. 2. It should be noted that although only three layers of composite layers are described this invention, the ability to form a low defect density relaxed silicon-germanium layer, can be accomplished using between about 1 to 5 composite layers, all grown in situ in the same growth apparatus, and all grown at a the same temperature. The ability to form the entire group of composite layer in situ in the same tool and at the same temperature improves throughput as well as manufacturabilty. Again after growth of the multiple composite layers, silicon-germanium layer 11, is again in situ grown. This is schematically shown in FIG. 2.

Figure 3:
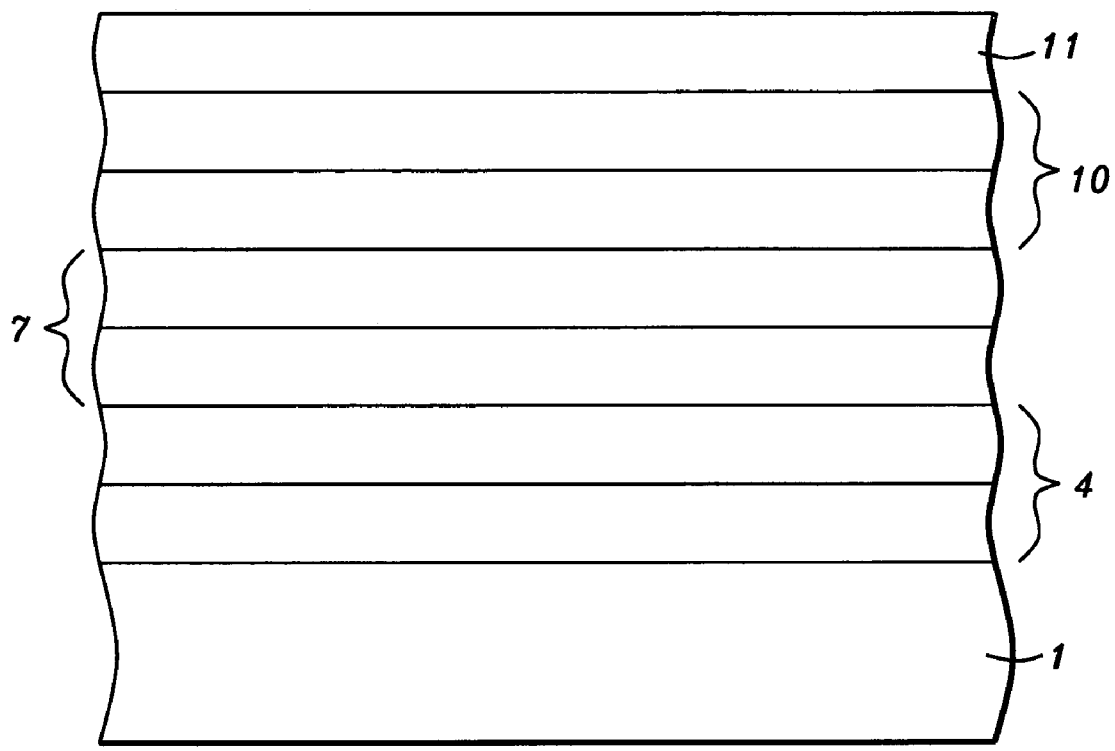

After growth of the multiple composite layers and the overlying thicker silicon-germanium layer 11, a critical anneal procedure is performed to enhance silicon-carbon micro crystal formation which in turn results in a relaxed overlying silicon-germanium layer, featuring a defect density minimized as a result of the reduction of threading dislocations. The anneal procedure is performed at a temperature between about 800 to 1000° C., in an inert ambient comprised of either hydrogen, nitrogen or argon, with the anneal either performed in situ after growth of the multiple composite layers and thicker silicon-germanium layer 11, or performed ex situ in another apparatus. Silicon-germanium layer 9, of composite layer 10, is now in the desired relaxed situation to allow an overlying silicon layer to be grown, and wherein the overlying silicon layer will be comprised of tensile strain, and exhibit a low defect density as a result of a minimum level of threading dislocations in underlying silicon-germanium layer 9. Therefore silicon layer 12, schematically shown in FIG. 3, is grown either in situ in the same apparatus used for growth and annealing of the multiple composite layers as well as for thicker silicon-germanium layer 11, or grown in a different apparatus, again at a temperature between about 500 to 700° C., using silane or disilane as a silicon source. Silicon layer 12, grown to a thickness between about 100 to 200 Angstroms can now be used to accommodate a device such as a MOSFET, wherein the mobility of carriers in the MOSFET channel region will be increased as a result of being located in the strained silicon layer.

It should be noted that the growth conditions, such as MBE or LPCVD, temperature, source, etc, described in this invention for the composite layers, for the thicker silicon-germanium layer, and for the silicon layer, were chosen so that the desired layer would exhibit the optimum epitaxial structure.

While this invention has been particularly shown and described with reference to, the preferred embodiments thereof, it will be understood by those skilled in the art that various changes in form and details may be made without departing from the spirit and scope of this invention.

What is claimed is:

1. A method of forming a semiconductor layer with tensile strain, comprising the steps of:
    providing a semiconductor substrate;
    forming a first type semiconductor alloy layer on said semiconductor substrate;
    forming a second type semiconductor alloy layer on said first type semiconductor alloy layer, resulting in a composite layer comprised of overlying, said second type semiconductor alloy layer on said first type semiconductor alloy layer;
    forming multiple composite layers on underlying said composite layer, with each composite layer of said multiple composite layers comprised with an overlying second type semiconductor alloy layer and of an underlying first type semiconductor alloy layer;
    forming a thick second type semiconductor alloy layer;
    performing an anneal procedure insitu in an hydrogen ambient resulting in an overlying composite layer comprised with a relaxed second type semiconductor alloy layer; and
    forming said semiconductor layer via LPCVD or MBE procedures wherein said semiconductor layer is formed under tensile strain on underlying, said thick second type semiconductor alloy and wherein said semiconductor layer is formed in same apparatus used for formation of said thick second type semiconductor alloy layer and for said anneal procedure.

2. The method of claim 1, wherein said semiconductor substrate is a single crystalline silicon substrate.

3. The method of claim 1, wherein said first type semiconductor alloy layer is a silicon-germanium-carbon layer.

4. The method of claim 1, wherein said first type semiconductor alloy layer is obtained via molecular beam epitaxy (MBE) or via low pressure chemical vapor deposition (LPCVD) procedures.

5. The method of claim 1, wherein said first type semiconductor alloy layer is grown to a thickness between about 20 to 500 Angstroms.

6. The method of claim 1, wherein said first type semiconductor alloy layer is comprised with an atomic percent of germanium between about 20 to 35%, and with an atomic percent of carbon between about 0.5 to 3%.

7. The method of claim 1, wherein said second type semiconductor alloy layer is a silicon-germanium layer.

8. The method of claim 1, wherein said second type semiconductor alloy layer is obtained via molecular beam epitaxy (MBE) or via low pressure chemical vapor deposition (LPCVD) procedures.

9. The method of claim 1, wherein said second type semiconductor alloy layer is grown to a thickness between about 20 to 500 Angstroms.

10. The method of claim 1, wherein said second type semiconductor alloy layer is comprised with an atomic percent of germanium between about 20 to 35%.

11. The method of claim 1, wherein the number of said multiple composite layers, wherein each composite layer is comprised with an overlying second type semiconductor alloy layer and an underlying first type semiconductor alloy layer, is between about 1 to 5.

12. The method of claim 1, wherein said thick second type semiconductor alloy layer is a silicon-germanium layer at a thickness between about 2,000 to 10,000 Angstroms, comprised with an atomic percent of germanium between about 20 to 35%.

13. The method of claim 1, wherein said anneal procedure is performed in a hydrogen ambient at a temperature between about 800 to 1000° C.

14. The method of claim 1, wherein said semiconductor layer is a silicon layer.

15. The method of claim 1, wherein said semiconductor layer is obtained via MBE or via LPCVD procedures at a thickness between about 100 to 200 Angstroms.

16. A method of forming a silicon layer featuring tensile strain, on an underlying relaxed silicon-germanium layer, comprising the steps of providing a semiconductor substrate;
    forming a first silicon-germanium-carbon layer on said semiconductor substrate;
    forming a first silicon-germanium layer on said first silicon-germanium-carbon layer, resulting in a first composite layer comprised of said first silicon-germanium layer on said first silicon-germanium-carbon, with the formation of said first silicon-germanium layer performed in situ in the same apparatus used for formation of said first silicon-germanium-carbon layer;
    forming of multiple composite layers in situ, on said first composite layer, with each composite layer of said multiple composite layers comprised with an overlying silicon-germanium layer and of an underlying silicon-germanium-carbon layer;
    forming a thick silicon-germanium layer;
    performing a hydrogen anneal procedure in situ, resulting an overlying composite layer of said multiple composite layer, comprised with said relaxed silicon-germanium layer; and
    forming said silicon layer featuring tensile strain, on underlying thick silicon-germanium layer which in turn overlays said relaxed silicon-germanium layer, with formation of said silicon layer performed in situ in same apparatus used for formation of composite layers, for formation of said thick silicon - germanium layer, and for said hydrogen anneal procedure.

17. The method of claim 16, wherein said semiconductor substrate is a single crystalline silicon substrate.

18. The method of claim 16, wherein said first silicon-germanium-carbon layer is obtained via molecular beam epitaxy (MBE) or via low pressure chemical vapor deposition (LPCVD) procedures.

19. The method of claim 16, wherein said first silicon-germanium-carbon layer is grown to a thickness between about 20 to 500 Angstroms.

20. The method of claim 16, wherein said first silicon-germanium-carbon layer is comprised with an atomic percent of germanium between about 20 to 35%, and with an atomic percent of carbon between about 0.5 to 3%.

21. The method of claim 16, wherein said first silicon-germanium layer is obtained via molecular beam epitaxy (MBE) or via low pressure chemical vapor deposition (LPCVD) procedures, grown to a thickness between about 20 to 500 Angstroms.

22. The method of claim 16, wherein said first silicon-germanium layer is comprised with a weight percent of germanium between about 20 to 35%.

23. The method of claim 16, wherein the number of said multiple composite layers, wherein each composite layer is comprised with an silicon-germanium layer and an underlying silicon-germanium-carbon layer, is between about 1 to 5.

24. The method of claim 16, wherein said thick silicon-germanium layer is comprised with a thickness between about 2,000 to 10,000 Angstroms, and comprised with an atomic percent of germanium between about 20 to 35%.

25. The method of claim 16, wherein said anneal procedure is performed at a temperature between about 800 to 1000° C., in a hydrogen, argon, or nitrogen ambient.

26. The method of claim 16, wherein said silicon layer is obtained via MBE or via LPCVD procedures.

27. The method of claim 16, wherein said silicon layer is obtained at a thickness between about 100 to 200 Angstroms.

* * * * *